Jan. 13, 1970 H. BECKE ET AL 3,488,835

TRANSISTOR FABRICATION METHOD

Original Filed June 29, 1965 3 Sheets-Sheet 1

INVENTORS:
HANS BECKE,
ERICK F. CAVE &
DANIEL STOLNITZ

BY Robert P. Williams
Attorney

INVENTORS:
HANS BECKE,
ERIC F. CAVE &
DANIEL STOLNITZ

BY Robert D. Williams
Attorney

INVENTORS:
HANS BECKE,
ERIC F. CAVE &
DANIEL STOLNITZ

BY Robert P. Williams
Attorney

1

3,488,835
TRANSISTOR FABRICATION METHOD
Hans Becke, Morristown, and Eric F. Cave, Somerville, N.J., and Daniel Stolnitz, New York, N.Y., assignors to RCA Corporation, a corporation of Delaware
Original application June 29, 1965, Ser. No. 467,885, now Patent No. 3,355,636, dated Nov. 28, 1967. Divided and this application Nov. 1, 1967, Ser. No. 718,274
Int. Cl. B01j *17/00;* H01l *1/16*
U.S. Cl. 29—577 8 Claims

ABSTRACT OF THE DISCLOSURE

A method of fabricating a transistor having improved power handling capability comprises the steps of laminating two wafers under heat and pressure, one wafer including N type and P type layers and the other wafer comprising alternate strips of P+ type and N+ type semiconductor material joined together by insulating silicon dioxide. The wafers are joined together with the P+ and N+ material extending at an angle to the N type and P type layers in the first wafer so that impurities from the N+ and P+ strips diffuse into one of the layers of the first wafer to form the transistor junctions.

This application is a division of U.S. application Ser. No. 467,885, filed June 29, 1965, now Patent 3,355,636.

This invention relates generally to transistors, and more particularly to a novel transistor of the diffused type and to an improved method of making it. The novel diffused transistor of the present invention is especially useful for relatively high power and high frequency applications.

It has been proposed to make a transistor by (1) coating alternate metal plates in a stack with donor and acceptor metals, respectively, (2) insulating the coated plates from each other, and (3) forming alloyed junctions between the ends of the plates and a layer of semiconductor material of one conductivity type, the latter layer being superimposed on a layer of semiconductor material of the opposite conductivity type. Such prior art transistors are of the alloy type and do not exhibit the high frequency and high power performance characteristics of which the diffused transistors are capable. Also, such prior art transistors do not lend themselves to methods of mass production manufacture, and the coefficient of expansion of the metal plates must closely match the coefficient of expansion of semiconductor material to which they are alloyed to prevent failure of the transistors during high power applications.

A limiting factor of the highest frequency of operation obtainable by prior art diffused transistors is the value of their base spreading resistance, the latter being determined, in part, by the distance between the emitter and the base contacts. Since this distance is usually obtained by photolithographic techniques, the smallest distance is still several microns in length, even in the best prior art diffused transistors.

It is an object of the present invention to provide a novel diffused transistor and an improved method of making it that overcome the objections to the aforementioned alloyed and diffused transistors and method of manufacture of the prior art.

Another object of the present invention is to provide a novel diffused transistor whose component parts have substantially the same coefficient of expansion and that can be manufactured by an improved method that lends itself to mass production operations.

Still another object of the present invention is to provide a novel diffused transistor whose base spreading re-

2 sistance can be lowered by at least one order of magnitude by the improved method of manufacture of the present invention, thereby providing a diffused transistor of higher frequency capabilities than those of the prior art.

A further object of the present invention is to provide a novel diffused transistor that is relatively simple in construction, efficient in use, and lends itself to manufacture by an improved method that is relatively easy and inexpensive to carry out.

Briefly, the novel diffused transistor comprises a laminate of two wafers, one wafer itself comprising a laminate of alternate strips of P+ type and N+ type semiconductor material bonded together by an electrical insulating material, and the other wafer comprising N type, and P type layers of semiconductor material.

The novel diffused transistor may be manufactured by pressing the wafers together so that the P type layer, comprising a major surface of one wafer, is disposed against the alternate P+ type and N+ type areas comprising a major surface of the other wafer. Such pressing is carried out for a time and at a temperature and pressure to join the wafers to each other and to diffuse donor and acceptor atoms from the N+ type and P+ type strips, respectively, into the P type layer to a depth of at least one diffusion length. Thus, diffused junctions between the P+ type and N+ type strips on the one hand and the P type layer on the other hand are formed; and the N+ type strip, the P+ type strip, and the N type layer become the emitter, base, and collector contacts, respectively, of the diffused transistor.

While the present invention will be described by an improved method of making a novel diffused NPN transistor, it is within the scope of the invention to make a novel, diffused PNP transistor also. To make the novel, diffused PNP transistor, a wafer comprising P+ type, P type, and N type layers of semiconductor material is merely substituted for the wafer of N+ type, N type, and P type layers in the aforementioned process.

The novel features of the present invention, both as to its organization and method of operation, as well as additional objects and advantages thereof, will be more readily understood from the following description, when read in connection with the accompanying drawings in which similar reference characters represent similar parts throughout, and in which.

Figures 1, 2, 3, 4, 5, 6, 7:
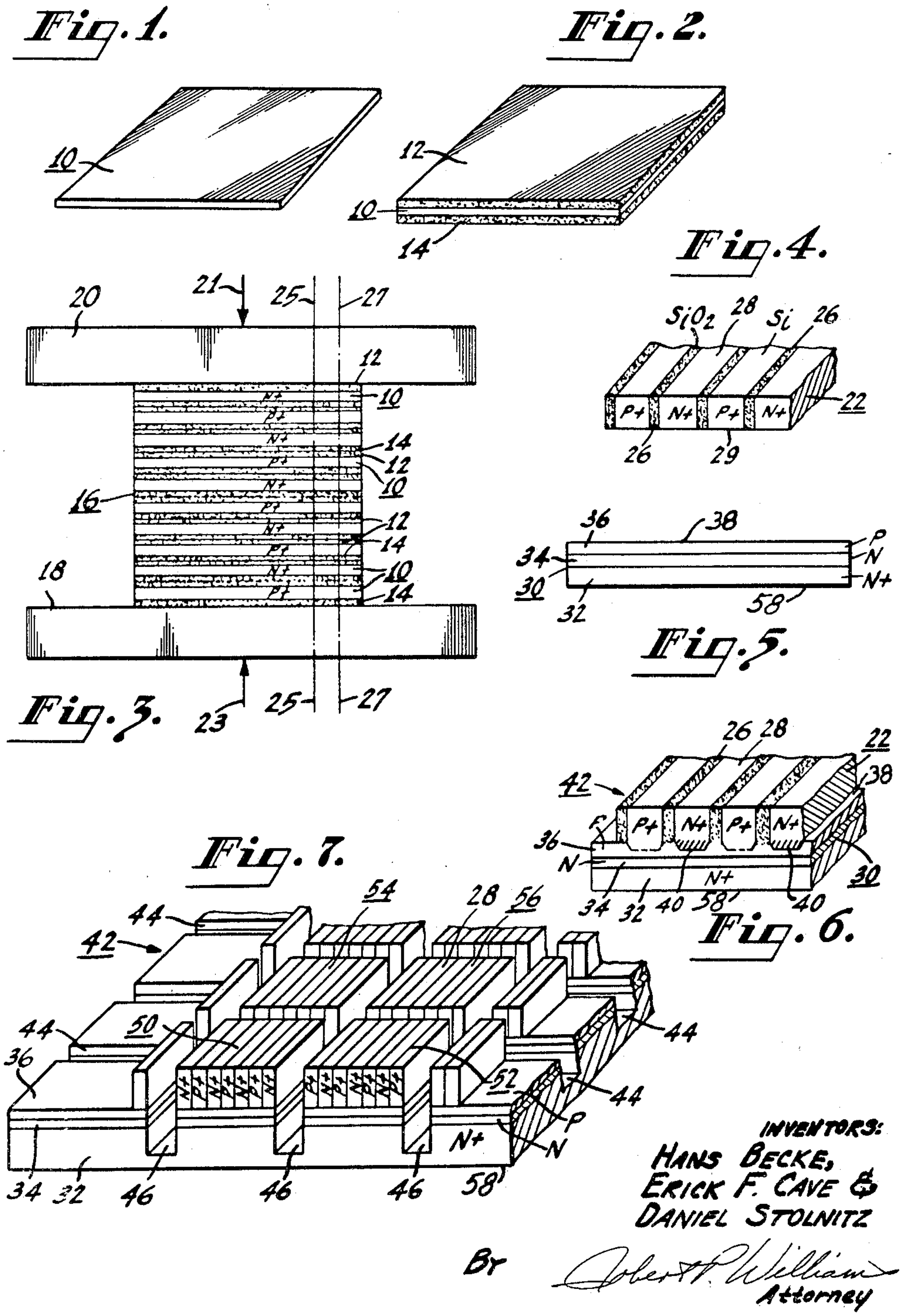
FIG. 1 is a perspective view of a sheet of semiconductor material used in the manufacture of the improved diffused transistors.
FIG. 2 is a perspective view of the sheet of semiconductor material after its opposed major surfaces have been oxidized.
FIG. 3 is a front elevational view of a stack of oxidized sheets of semiconductor material under pressure, in one of the steps of the present method of making diffused transistors.
FIG. 4 is a fragmentary perspective view of a composite wafer used in the present method of making diffused transistors.
FIG. 5 is a front elevational view of another wafer of semiconductor material used in the present method of making diffused transistors.
FIG. 6 is a fragmentary perspective view of the composite wafer illustrated in FIG. 4 fused to the wafer illustrated in FIG. 5, during one of the operations of the present method of making diffused transistors.
FIG. 7 is a fragmentary perspective view showing grooves formed in the fused wafers prior to a glassing operation in accordance with the present method.

Referring now particularly to FIG. 1 of the drawings, there is shown a sheet 10 of semiconductor material, such as silicon, germanium, or gallium arsenide. The sheet 10 is preferably of rectangular shape and is formed from a single crystal of heavily doped semiconductor material such as N+ type or P+ type silicon, germanium, or gallium arsenide, for example. The sheet 10 may be about one-inch square and between five and twenty-five mils thick.

An electrical insulating and physically bonding material is adherently deposited or formed on the two major surfaces of the sheet 10 by any suitable method known in the art. For example, the sheet 10 of silicon may be oxidized by heating it in steam, containing air and/or pure oxygen, to a temperature between 1200° C. and 1250° C. until the major surfaces of sheet 10 are covered with upper and lower oxide layers 12 and 14 of a desired thickness, as shown in FIG. 2. Where the sheet 10 is of silicon, the oxide layers 12 and 14 are silicon dioxide. A suitable oxide may also be formed on the sheet 10 of silicon by heating it in steam containing silicon tetrachloride or in a hydrogen carrier containing silicon tetrachloride and carbon dioxide, in a manner known in the art. Suitable oxides may also be formed on the sheet 10 by the decomposition of organic oxysilane compounds by known techniques. The oxide coated sheet 10 in FIG. 2 is shown with its peripheral edges trimmed so that the silicon sheet 10 can be seen plainly between the oxide layers 12 and 14.

A plurality of oxidized sheets 10 are superimposed on each other to form a stack 16 wherein the upper oxide layer 12 of a sheet 10 is adjacent to the lower oxide layer 14 of the next higher adjacent sheet 10. The number of oxidized sheets 10 in any stack 16 will depend upon the size of the ultimate composite wafer desired. In the stack shown in FIG. 3, ten sheets 10 are superimposed upon each other to form the stack 16. For the purpose of producing a diffused transistor, the sheets 10 in the stack 16 should be alternately interleaved P+ type and N+ type semiconductor material, as indicated in FIG. 3. N+ type and P+ type semiconductor silicon has a resistivity of about 0.001 ohm-centimeter.

To form a composite wafer 22, shown in FIG. 4, the stack 16 is placed between parallel blocks 18 and 20 of graphite to prevent scratching of the lower oxide layer 14 and the upper oxide layer 12 of the lowermost and uppermost sheets 10, respectively. The entire assembly is then placed in a press (not shown) wherein the stack 16 is compressed by forces in the directions normal to the major surfaces of the sheets 10, as indicated by the arrows 21 and 23 in FIG. 3. Depending upon the oxide and material of sheets 10, the pressure applied between the blocks 18 and 20 may be from about 100 p.s.i. to about 2,000 p.s.i. While the pressure is applied, the stack 16 is heated, in an induction furnace (not shown), for example, to a temperature at which the oxide layers 12 and 14 soften, usually between 1200° C. and 1250° C. for silicon, for example. Under these conditions of heat and pressure, adjacent oxide layers 12 and 14 of adjacent sheets 10 of the stack 16 fuse, that is, become bound to each other in about three minutes, and the stack 16 becomes an integral structure.

The stack 16 of fused sheets 10 is now sliced, preferably by cutting the stack 16 perpendicularly to the major surfaces of the oxide layers 12 and 14 to form the composite wafer 22, shown in FIG. 4. The wafer 22 may be a slice included between the planes indicated by the broken lines 25 and 27 illustrated in FIG. 3, having new major surfaces 28 and 29 normal to the old. Thus, the wafer 22 is a composite or laminate of alternate strips of N+ type and P+ type semiconductor material, of rectangular cross-section, separated from each other by fused silicon dioxide 26, a good electrical insulator; and each of the major surfaces 28 and 29 comprises alternate areas of N+ type and P+ type semiconductor material.

Referring now to FIG. 5 of the drawings, there is shown a wafer 30 of semiconductor material that is also used in making the diffused transistor of the present invention. The wafer 30 comprises a laminate including a substrate layer 32 of N+ type semiconductor material, an N type layer 34 of semiconductor material, and a P type layer 36 of semiconductor material. The wafer 30 has upper and lower major surfaces 38 and 58. The semiconductor material of the wafer 30 may, e.g., be silicon, germanium, or gallium arsenide, and the layers 34 and 36 may be disposed on the substrate layer 32 by any suitable means, as by epitaxial deposition, described in RCA Review, volume XXIV, No. 4, December 1963, for example. The layers 32, 34, ad 36 may also be produced by impurity diffusion methods well known in the semiconductor technology. The N+ type layer 32, the N type layer 34, and the P type layer 36 may have typical resistivities in the order of about 0.001 ohm-cm., 5 ohm-cm., and 1 ohm-cm., respectively.

A plurality of diffused transistors are formed by joining the composite wafer 22 to the wafer 30. This is accomplished by disposing the major surface 29 of the wafer 22 against the major surface 38 of the wafer 30 and applying sufficient pressure and heat between the wafers for a time sufficient to fuse them to each other and to diffuse donor and acceptor atoms from the N+ type and P+ type strips, respectively, of the wafer 22 into the P type layer 36 to a depth of at least one diffusion length. The diffusion length is the linear distance in which the concentration of the charge carriers falls, due to recombination, to $1/e$ of its original value, $e$ being the base of natural logarithms. The time, temperature, and pressure of this fusing operation is adjusted so as to obtain an outdiffusion (i.e. a release of impurities) from the P+ type and N+ type strips of the wafer 22 to yield a desired basewidth and to move the emitter junction at least one diffusion length away from the original interface between the wafers 22 and 30. The outdiffusion from the N+ type strips forms PN junctions 40 with the P type layer 36 at least one diffusion length from the interface between the wafers, and the outdiffusion from the P+ strips tends to lower the base spreading resistance in the P type layer 36. This procedure reduces possible interference of crystal imperfections at the interface with transistor performance. If the conditions for producing the diffusion of donor and acceptor atoms from the N+ type and P+ type strips into the P type layer 36 are not compatible with the conditions for fusing the wafers 22 and 30 together, an additional diffusion operation may be carried out independently in a standard diffusion furnace subsequent to the fusing operation, in a manner well known in the art.

Where the wafers 22 and 30 are of silicon, they may be fused together and the PN junctions 40 formed under a pressure between 500 p.s.i. and 10,000 p.s.i. and a temperature between 1,000° C. and 1,300° C. applied for a time between one minute and several hours. Where the wafers 22 and 30 are of germanium or gallium arsenide, the heating temperature range is between 700° C. and 900° C., the rest of the conditions remaining substantially the same as for silicon.

In the fused laminate 42, comprising the joined wafers 22 and 30, the N+ type strips 28, the P+ type strips 29, and the N+ type layer 32 comprise emitter, base, and collector contacts, respectively, of a diffused NPN transistor. While only one N+ type strip and P+ type strip is necessary to form the emitter and base contacts of a separate diffused transistor, the N+ type layer 32 being a collector contact common to all of the diffused transistors, it is usually desirable to produce diffused transistors wherein a number of N+ type strips are connected in common to form a combined emitter contact and a number of P+ type strips are connected in common to provide a combined base contact. With this arrangement, a diffused transistor has a larger current-carrying capacity than is possible with only a single N+ type strip and a single P+ type strip for its respective emitter and base contacts. Thus, a number of discrete diffused transistors can be formed from the fused laminate 42 by forming in the fused laminate 42 one series of parallel spaced-apart grooves 44 disposed at substantially right angles to another series of parallel spaced-apart grooves 46, as shown in FIG. 7. The grooves 44 and 46 pass completely through the wafer 22 and extend well into the wafer 30. The grooves 44 and 46 may be formed by machining, sawing, or ultrasonic operations well known in the art.

The mesas in the fused laminate 42 (FIG. 7) defined by the grooves 44 and 46, comprise, for example, diffused transistors 50, 52, 54 and 56 wherein a number of N+ type strips and P+ type strips will be connected in common to form the emitter and base contacts, respectively, of the diffused transistors, the N+ type layer being a collector electrode common to all of the diffused transistors so formed.

The fused laminate 42 is etched in any suitable etching solution and then oxidized by any one of the aforementioned methods of oxidation, thus passivating the exposed parts of the emitter and collector junctions.

Figure 7A:
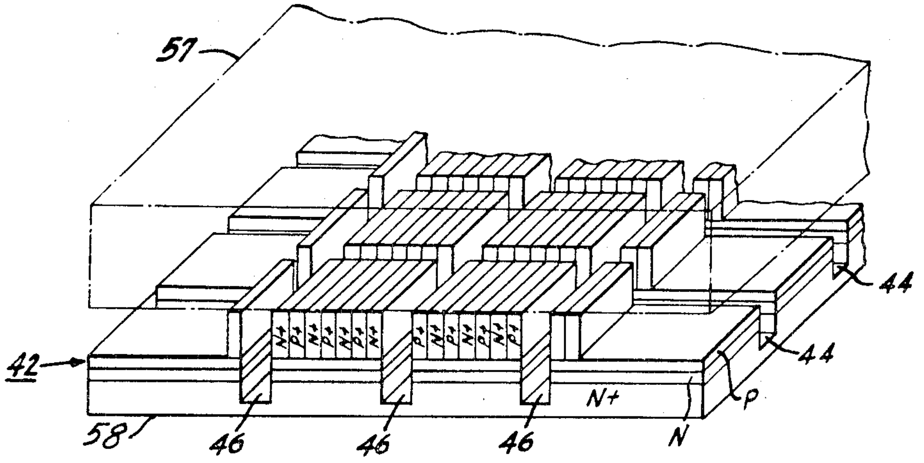
FIG. 7A is a view similar to that of FIG. 7, but showing a wafer of glass (in phantom) disposed on the fused wafers of semiconductor material prior to softening the glass and forcing it into the grooves.
Figure 8:
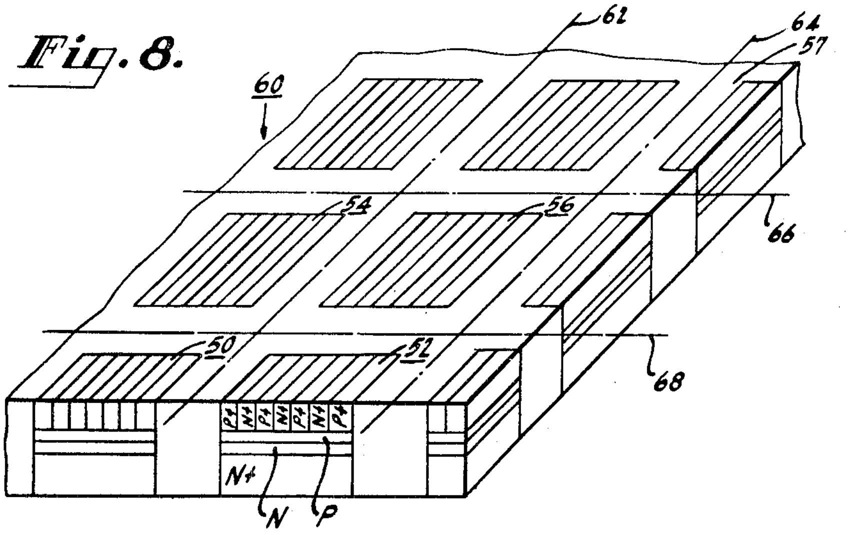
FIG. 8 is a fragmentary perspective view of a plurality of diffused transistors after the glassing operation in accordance with the present method.

Insulating and passivating material is now disposed in the grooves 44 and 46. This is accomplished by placing a wafer of suitable glass 57 (FIG. 7A), such as a lime-alumino-silicate glass (e.g. #1715 glass, #7070 glass, or "Pyrex" glass, manufactured by the Corning Glass Company) on the upper surface 28 of the grooved, fused laminate 42 and heating, as in an induction furnace (not shown), to the softening point of the glass 57 while pressing the latter into the grooves 44 and 46 (FIG. 8). The upper and lower surfaces 28 and 58 of the fused laminate 42 are now lapped. The surface 58 is lapped to a depth below the floor of the grooves 44 and 46 so that the diffused transistors 50, 52, 54 and 56 are completely isolated from each other by the glass 57, as shown in FIG. 8.

The P+ type strips, N+ type strips, and the N+ type layer are metallized to provide means to which electrical connections can be easily and conveniently made. This is achieved conveniently by immersing the glassed, fused laminate 60, shown in FIG. 8, in a nickel plating immersion bath. The latter bath is preferably of the type wherein nickel plates onto the P+ type and N+ type strips and the N+ type layer when the glassed fused laminate 60 is immersed in the solution. Such nickel plating immersion solutions are well known in the art. In the immersion nickel plating process, nickel is plated onto the semiconductor material only, no nickel adhering to the silicon dioxide 26 between the P+ type and N+ type strips. The glassed fused laminate 60 is dipped next in solder to provide a coating of solder on the nickel plating. Other methods, such as metal evaporation methods, can also be used to plate the contacts of the diffused transistors, but the immersion nickel plating method is preferred because it avoids the use of masking procedures.

Discrete diffused transistors, such as the diffused transistors 50, 52, 54 and 56, for example, can now be separated from each other by cutting through the glass 57 as along the dashed lines 62, 64, 66 and 68, for example.

Figure 10:
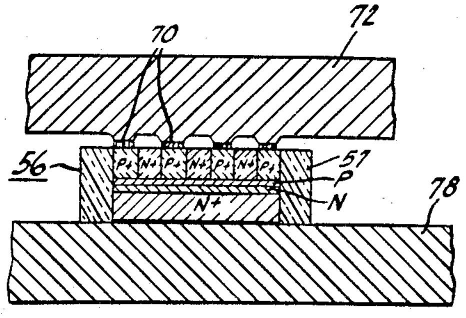
FIG. 10 is a fragmentary cross-sectional view taken along the line 10—10 in FIG. 9.
Figure 9:
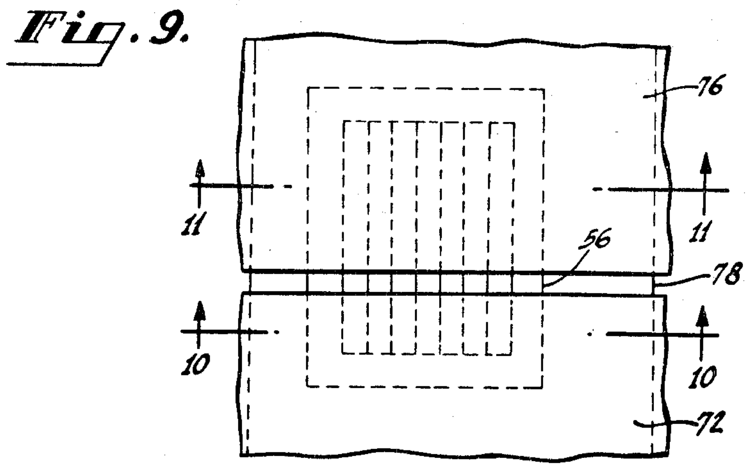
FIG. 9 is a fragmentary plan view of one embodiment of the improved diffused transistor, showing the application of emitter and base heat sinks thereto.
Figure 11:
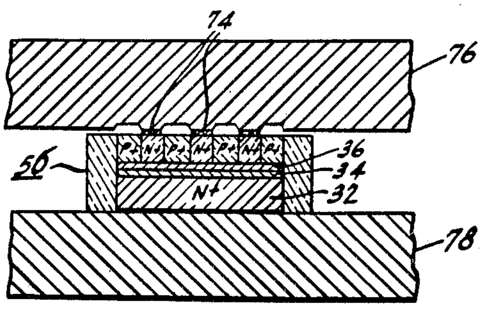
FIG. 11 is a fragmentary cross-sectional view taken along the line 11—11 of FIG. 9.

Referring now to FIGS. 9, 10 and 11 there is shown a diffused transistor 56 wherein all of the P+ type strips are connected by parallel ridges 70 in a metal base heat sink 72. The heat sink may be a heavy sheet of copper and can be connected to the P+ strips by means of solder to comprise the base terminal of the diffused transistor 56, as shown in FIG. 10. The N+ type strips of the diffused transistor 56 are soldered to ridges 74 of an emitter heat sink 76 to form a common emitter terminal and to dissipate heat. The N+ layer is soldered to a collector heat sink 78, as shown in FIGS. 10 and 11.

From the foregoing description, it will be apparent that there has been provided a novel diffused transistor and an improved method of making it. The diffused transistor is well suited for high power applications because heat sinks can be applied to opposite sides thereof, thereby providing excellent terminal heat dissipation. Also, the component wafers of the diffused transistor have substantially the same coefficient of expansion, rendering structural stability to the transistor at high temperatures of operation. The diffused transistors have a very low $R_{bb}$, base spreading resistance, due to the P+ type base fusion and the proximity of the base contact to the emitter contact. This base spreading resistance is determined by the thickness of the silicon oxide layer between the N+ type and P+ type strips, and this thickness can be a fraction of one micron, resulting in transistors capable of providing signals of high frequency. The diffused transistors are hermetically sealed by glassing, are very rugged, and are made by a simple process that does not require thermal compression bonding operations or photolithographic techniques.

While only one embodiment of the diffused transistor and method of making it have been described, variations in the structure of the transistor and in the operations of the method, all coming within the spirit of this invention, will, no doubt, suggest themselves to those skilled in the art. Hence, it is desired that the foregoing description shall be considered as illustrative and not in a limiting sense.

What is claimed is:

1. A method of making a transistor comprising the steps of:

disposing a first major surface of a first wafer of semiconductor material against a second major surface of a second wafer of semiconductor material, said first wafer comprising N type and P type layers, said first major surface being a surface of said P type layer, said second wafer comprising alternate strips of P+ type and N+ type semiconductor material bound to each other by an electrical insulating material, and said second major surface comprising alternate areas of said P+ type and said N+ type strips, and pressing said first and second wafers together while heating them at a temperature at which said wafers are joined to each other and donor and acceptor atoms from said N+ type and P+ type areas, respectively, diffuse into said P type layer to form diffused junctions between said P+ type and N+ type strips and said P type layer, whereby said N+ type strip and said P+ type strip form the emitter and the base contacts, respectively, of said transistor.

2. A method of making transistors comprising the steps of:

disposing a first major surface of a first wafer of semiconductor material against a second major surface of a second wafer of alternate strips of P+ type and N+ type semiconductor material bound together by an electrical insulating material, said first wafer comprising N type and P type layers, and said first major surface being a surface of said P type layer, and said second wafer having alternate areas of said P+ type and said N+ type strips on said second major surface, and pressing said first and second wafers together with a pressure of about 1700 p.s.i. while heating them at a temperature of about 1230° C. for about 3 minutes so that some of the donor and acceptor atoms from said N+ type and P+ type areas, respectively, diffuse into said P type layer to form diffused junctions between said P+ type and N+ type strips and said P type layer, whereby said N+ type strip and said P+ type strip form the emitter and the base contacts, respectively, of said transistors.

3. A method of making transistors comprising the steps of:

disposing a first major surface of a first wafer of semiconductor material against a second major surface of a second wafer of alternate strips of P+ type and N+ type semiconductor material bound to each other by an electrical insulating material, said first wafer comprising N type and P type layers, said first major surface comprising a surface of said P type layer, and said second major surface comprising alternate areas of said P+ type and said N+ type strips, and pressing said first and second wafers together with a pressure in the range between 500 p.s.i. and 10,000 p.s.i. while heating them at a temperature in the range between 1000° C. and 1300° C. for a time in the range between 1 minute and 5 hours to join said first wafer to said second wafer and to diffuse some of the donor and acceptor atoms from said N+ type and P+ type areas, respectively, into said P type layer to a depth of at least one diffusion length to form diffused junctions between said P+ type and N+ type strips and said P type layer, whereby said N+ type strip and said P+ type strip form the emitter and the base contacts, respectively, of said transistors.

4. A method of making a transistor comprising the steps of:

disposing a first major surface of a first wafer of semiconductor material against a second major surface of a second wafer of semiconductor material, said first wafer comprising P type and N type layers, said first major surface being a surface of said N type layer, said second wafer comprising alternate strips of N+ type and P+ type semiconductor material bound to each other by an electrical insulating material, and said second major surface comprising alternate areas of said N+ type and said P+ type strips, and pressing said first and second wafers together while heating them at a temperature at which said wafers are joined to each other and acceptor and donor atoms from said P+ type and N+ type areas, respectively, diffuse into said N type layer to form diffused junctions between said N+ type and P+ type strips and said N type layer, whereby said P+ type strip and said N+ type strip form the emitter and the base contacts, respectively, of said transistor.

5. A method of making transistors comprising the steps of:

disposing a first major surface of a first wafer of semiconductor material against a second major surface of a second wafer of alternate strips of N+ type and P+ type semiconductor material bound together by an electrical insulating material, said first wafer comprising P type and N type layers, said first major surface being a surface of said N type layer, and said second wafer having alternate areas of said N+ type and said P+ type strips on said second major surface, and pressing said first and second wafers together with a pressure of about 1700 p.s.i. while heating them at a temperature of about 1230° C. for about 3 minutes so that some of the acceptor and donor atoms from said P+ type and N+ type areas, respectively, diffuse into said N type layer to form diffused junctions between said N+ type and P+ type strips and said N type layer, whereby said P+ type strip and said N+ type strip form the emitter and the base contacts, respectively, of said transistors.

6. A method of making transistors comprising the steps of:

disposing a first major surface of a first wafer of semiconductor material against a second major surface of a second wafer of alternate strips of N+ type and P+ type semiconductor material bound to each other by an electrical insulating material, said first wafer comprising P type and N type layers, said first major surface comprising a surface of said N type layer, and said second major surface comprising alternate areas of said N+ type and said P+ type strips, and pressing said first and second wafers together with a pressure in the range between 500 p.s.i. and 10,000 p.s.i. while heating them at a temperature in the range between 1000° C. and 1300° C. for a time in the range between 1 minute and 5 hours to join said first wafer to said second wafer and to diffuse some of the acceptor and donor atoms from said P+ type and N+ type areas, respectively, into said N type layer to form diffused junctions between said N+ type and P+ type strips and said N type layer, whereby said P+ type strip and said N+ type strip form the emitter and the base contacts, respectively, of said transistors.

7. A method of making diffused transistors comprising the steps of:

oxidizing a plurality of sheets of semiconductor material to form an oxide thereon, some of said sheets being N+ type semiconductor material and others of said sheets being P+ type semiconductor material, arranging said sheets in a stack so that said oxidized sheets of N+ type semiconductor material are interleaved with said oxidized sheets of P+ type semiconductor material, applying heat and pressure to said stack to soften said oxide, whereby to fuse said sheets to each other, slicing said stack of fused sheets transversely to the major surfaces of said sheets to obtain at least one wafer comprising alternate strips of N+ type and P+ type semiconductor material bound to each other by said oxide, said one wafer having opposite major surfaces each comprising separated alternate areas of said N+ type and P+ type semiconductor material, disposing one of said major surfaces of said one wafer against a major surface of another wafer, said other wafer comprising an N+ type layer, an N type layer, and a P type layer in the order named, said major surface of said other wafer comprising a major surface of said P type layer, heating and pressing said wafers together to join them and to cause some of the acceptor and donor atoms of said P+ type and N+ type areas, respectively, to diffuse into said P type layer, forming a plurality of grooves in said joined wafers to divide said joined wafers into a plurality of means, each of said grooves extending through said one wafer and into said other wafer, disposing insulating material in said grooves, lapping said joined wafers until said mesas are completely isolated from each other by said insulating material, cutting through said insulating material to separate said mesas from each other, each of said separated mesas having at least one of said N+ type strips, one of said P+ type strips, and a portion of said N+ type layer which comprise the emitter, base, and collector contacts, respectively, of one of said diffused transistors.

8. A method of making diffused transistors comprising the steps of:

oxidizing a plurality of sheets of semiconductor material to form an oxide thereon, some of said sheets being P+ type semiconductor material and others of said sheets being N+ type semiconductor material, arranging said sheets in a stack so that said oxidized sheets of P+ type semiconductor material are interleaved with said oxidized sheets of N+ type semiconductor material, applying heat and pressure to said stack to soften said oxide, whereby to fuse said sheets to each other, slicing said stack of fused sheets transversely to the major surfaces of said sheets to obtain at least one wafer comprising alternate strips of P+ type and N+ type semiconductor material bound to each other by said oxide, said one wafer having opposite major surfaces each comprising separated alternate areas of said P+ type and N+ type semiconductor material, disposing one of said major surfaces of said one wafer against a major surface of another wafer, said other wafer comprising a P+ type layer, a P type layer, and an N type layer in the order named, said major surface of said other wafer comprising a major surface of said N type layer, heating and pressing said wafers together to join them and to cause some of the acceptor and donor atoms of said P+ type and N+ type areas, respectively, to diffuse into said N type layer, forming a plurality of grooves in said joined wafers to divide said joined wafers into a plurality of mesas, each of said grooves extending through said one wafer and into said other wafer, disposing insulating material in said grooves, lapping said joined wafers until said mesas are completely isolated from each other by said insulating material, cutting through said insulating material to separate said mesas from each other, each of said separated mesas having at least one of said P+ type strips, one of said N+ type strips, and a portion of said P+ type layer which comprise the emitter, base, and collector contacts, respectively, of one of said diffused transistors.

References Cited

UNITED STATES PATENTS

| | | | |
|---|---|---|---|
| 3,152,939 | 10/1964 | Bornoman. | |
| 3,239,908 | 3/1966 | Nakamura | 29—577 |
| 3,307,239 | 3/1967 | Lepselter | 29—577 |
| 3,383,760 | 5/1968 | Schwartzman. | |

PAUL M. COHEN, Primary Examiner

U.S. Cl. X.R.

29—580, 583, 590